(12) United States Patent
Chen

(10) Patent No.: US 6,713,236 B2
(45) Date of Patent: Mar. 30, 2004

(54) LITHOGRAPHY METHOD FOR PREVENTING LITHOGRAPHIC EXPOSURE OF PERIPHERAL REGION OF SEMICONDUCTOR WAFER

(75) Inventor: Xiaochun Linda Chen, Hopewell Junction, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 55 days.

(21) Appl. No.: 10/188,532

(22) Filed: Jul. 3, 2002

(65) Prior Publication Data

US 2004/0005516 A1 Jan. 8, 2004

(51) Int. Cl.[7] .................................................. G03F 7/26
(52) U.S. Cl. ....................... 430/313; 430/311; 430/322; 430/327; 430/331
(58) Field of Search ................................ 430/311, 313, 430/322, 327, 331

(56) References Cited

U.S. PATENT DOCUMENTS

| | | | |
|---|---|---|---|
| 6,117,623 A | * | 9/2000 | Koshiyama et al. ........ 430/331 |
| 6,291,315 B1 | | 9/2001 | Nakayama et al. ......... 438/459 |

* cited by examiner

Primary Examiner—Kathleen Duda

(57) ABSTRACT

A lithography method for use in the manufacture of semiconductor devices, which prevents lithographic exposure of a periphery region or edge region of a semiconductor wafer and which prevents the formation of black silicon related particle contamination in a patterned region on the periphery region as a result of, e.g., a deep trench manufacturing process. A quencher solution is applied at peripheral areas of the wafer on which a photoresist layer is formed. The quencher solution neutralizes acid generated in the photoresist when the photoresist is exposed to radiation, thereby preventing the photoresist on the peripheral region of the wafer to dissolve during a subsequent developing process.

20 Claims, 4 Drawing Sheets

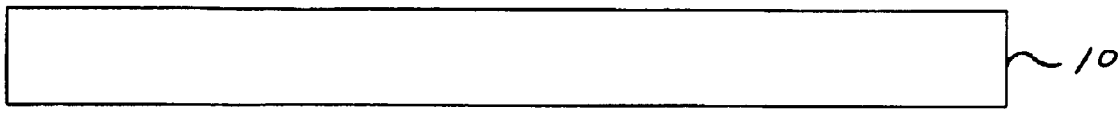
2a
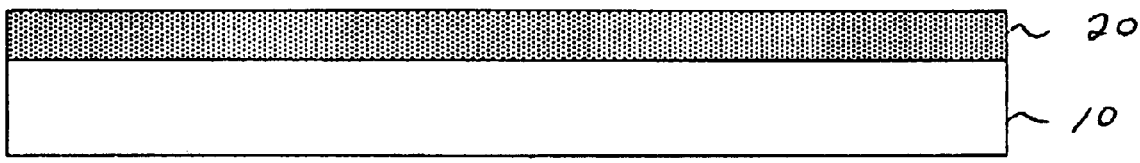
2b
(Resist Coating)
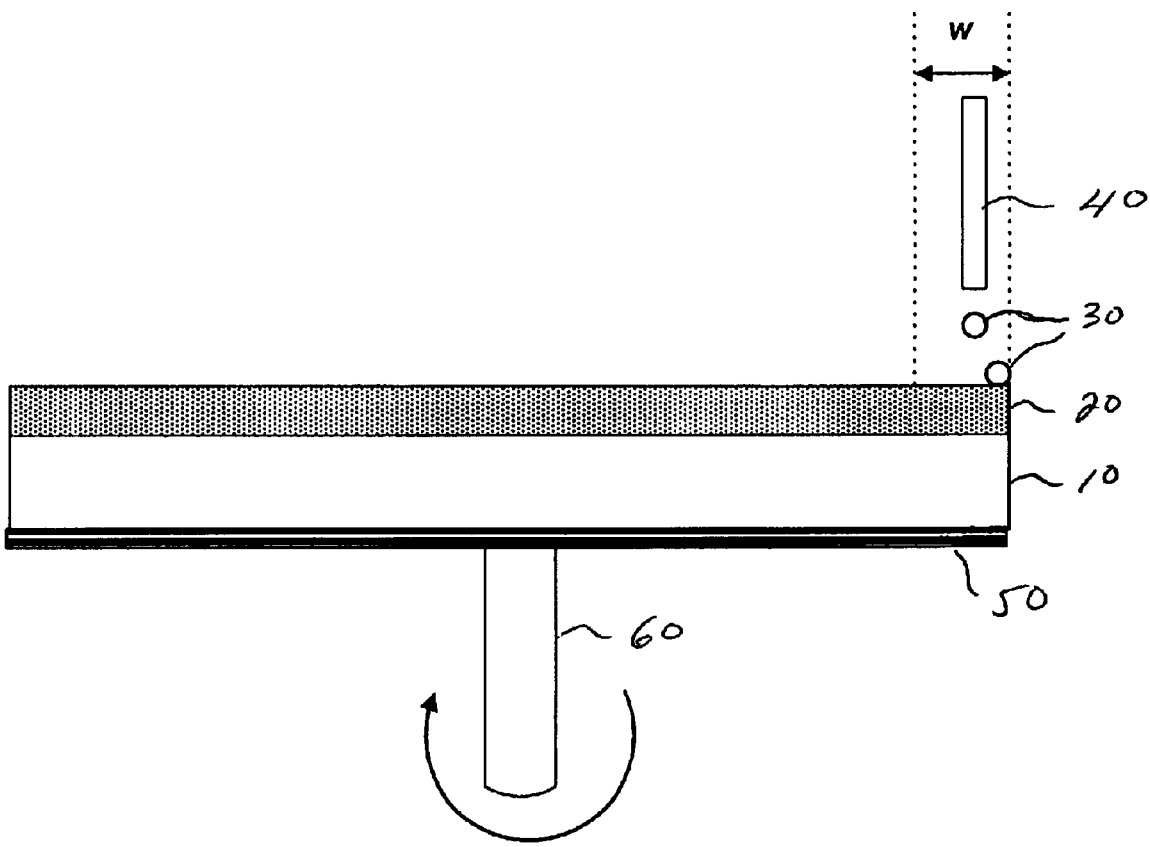
2c
(Treatment of Periphery)

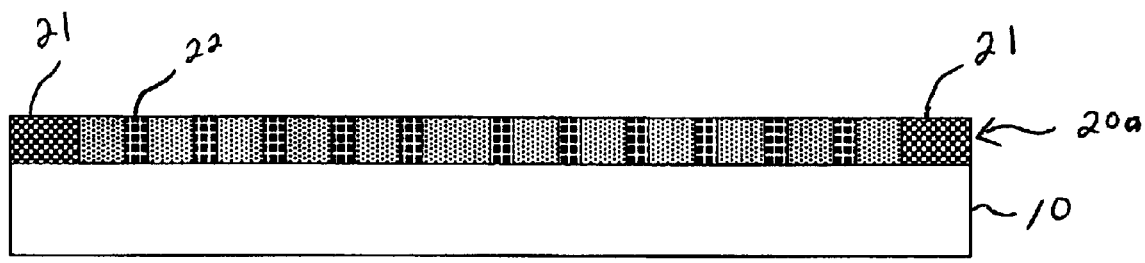
2d
(Exposure)
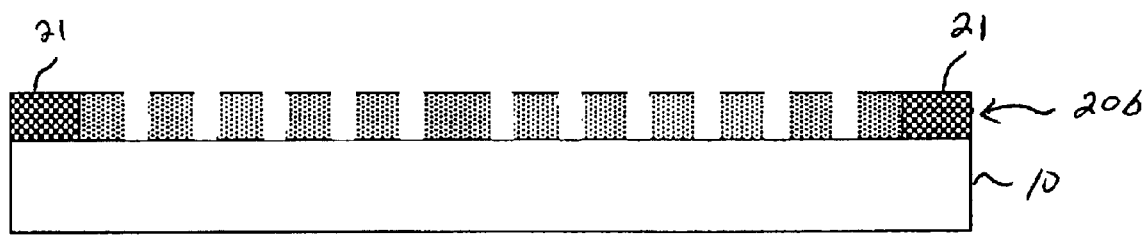
2e
(Development)

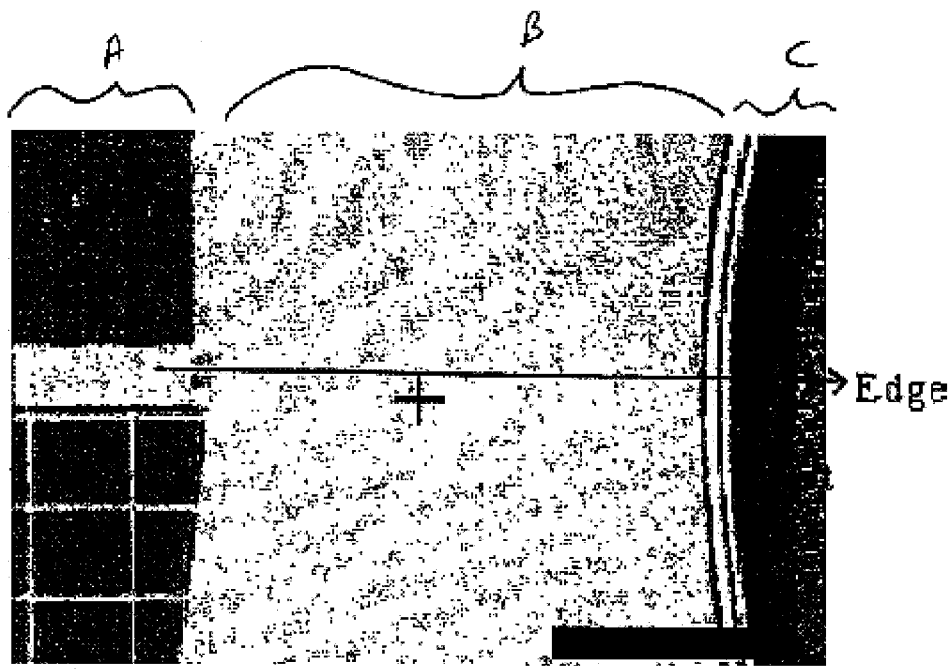
3a
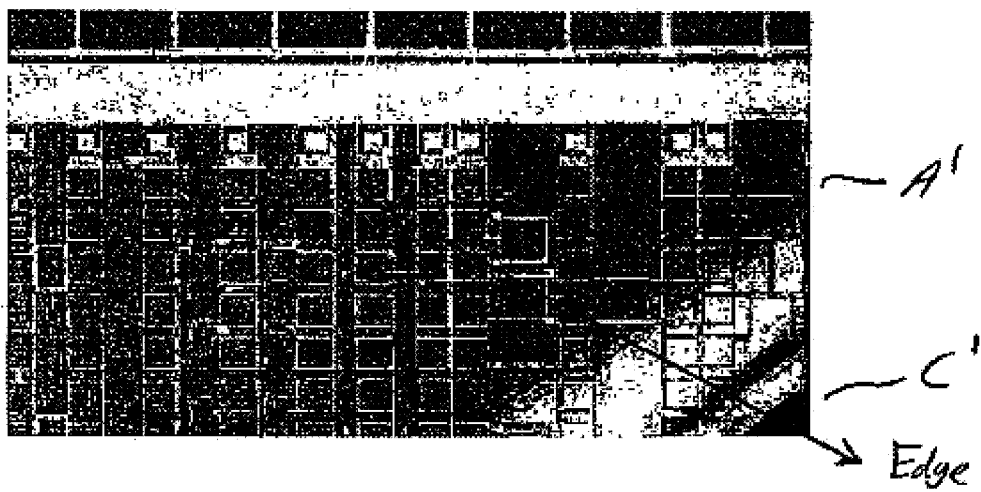
3b

LITHOGRAPHY METHOD FOR PREVENTING LITHOGRAPHIC EXPOSURE OF PERIPHERAL REGION OF SEMICONDUCTOR WAFER

BACKGROUND

1. Technical Field

The present invention relates to methods for manufacturing semiconductor devices and, more particularly, to a lithography method for preventing lithographic exposure of a periphery region of a semiconductor wafer.

2. Description of Related Art

Photolithography is a commonly used technique in the manufacture of semiconductor devices, which utilizes patterns to define regions on a silicon substrate. More specifically, with photolithography, a photoresist layer is formed, for example, on a substrate such as a silicon wafer, and then the resist layer is covered with a mask or reticle containing a pattern. The mask is exposed to radiation such as ultraviolet light (UV), X-ray, electron beam, and the like, which is transmitted through the transparent areas of the mask to cause a chemical reaction in corresponding regions of the photoresist.

There are various exposure apparatuses that may be used for photolithography. For example, a projection exposure apparatus, which is well-known in the art, is generally used, in which an image of a pattern formed on a reticle is transferred via a projection optical system onto, e.g., a wafer substrate applied with a photosensitive material such as photoresist on its surface. A reduction projection exposure apparatus (so-called stepper) based on the so-called "step-and-repeat" system is predominantly used as the projection exposure apparatus, in which a sensitive substrate is placed on a substrate stage that can be moved in two-dimensions. The sensitive substrate is moved in a stepwise manner (subjected to stepping) by using the substrate stage to repeat the operation for successively exposing respective shot areas on the sensitive substrate with the image of the pattern formed on the reticle.

Depending on the application, several resist types may be used. For example, with a negative type photoresist, the radiation impacted areas of the photoresist become insoluble in a developing solvent. For example, the radiation can initiate cross-linking, chain growth, photocondensation, or other such reaction to cause a chemical change in the photoresist. On the other hand, with a positive type photoresist, the radiation impacted areas become more soluble in a developing solvent. For example, the radiation can cause photodegradation of the photoresist molecular structure.

After radiation exposure, the photoresist is developed by exposure to a developing solvent which washes away the soluble portions of the photoresist, thereby forming a resist pattern. The resist pattern can be used for protecting the substrate during, e.g., etch or ion implantation. For example, an etching process can be conducted wherein the substrate is exposed to, e.g., an acid in a wet etch process, or an ion beam in a dry etch process, wherein the pattern can be used to form deep trenches by performing a deep trench mask opening (DTMO) process and a deep trench (DT) etching process. The areas of the substrate that are covered by the resist pattern remain unetched. The remaining photoresist is removed by a suitable solvent or other conventional removal methods, leaving the substrate with a pattern etched therein.

One disadvantage associated with the manufacture of semiconductor devices is the formation of "black silicon" at the wafer periphery. As is known in the art, "black silicon" may be formed for various reasons including, for example, lithographic exposure of the wafer edge. In particular, the black silicon is generally formed at the edge of the wafer due to uneven erosion of the photoresist layer, and it causes problems such as considerable contamination on the process and exposure tools (e.g., ion implanter), as well as a reduction in exposure resolution.

FIG. 1 is an exemplary schematic sectional side view of a wafer edge illustrating black silicon formation during trench etching process. FIG. 1 illustrates a silicon wafer 1 having a mask pattern 2 (e.g., oxide film) formed thereon for selectively etching the silicon wafer 1 to form trenches 3. During trench etching, the silicon at a periphery region 4 of the wafer 1 is widely exposed causing the formation of black silicon 5. During subsequent wafer processing, the projecting portions of the black silicon 5 can break down and become particles. These particles can cause a myriad of problems in manufacturing process, such as electrical insulation defects, which lowers the manufacturing yield, as well as the problems mentioned above such as tool contamination.

Methods for preventing the formation of "black silicon" are described, for example, in U.S. Pat. No. 6,291,315, issued to Nakayama et al., entitled "Method for Etching Trench in Manufacturing Semiconductor Devices". Briefly, one method disclosed in Nakayama for preventing formation of black silicon involves forming a thick oxide film in the peripheral region of a semiconductor wafer which functions as an insulating film for etching prevention when trenches are formed. In other words, during a reactive ion etching process, no silicon will be exposed in a region (e.g., periphery region) other than the region of the trench formation, thereby preventing formation of the black silicon on the wafer periphery.

Conventional methods for preventing formation of black silicon (such as the method described above) add complexity to the manufacturing process as they require additional complex steps, e.g., forming an oxide film layer at wafer periphery, in addition to typical photolithography and other semiconductor manufacturing processes.

Therefore, a need exists for a simplified method for preventing or mitigating the formation of black silicon on the periphery of a semiconductor wafer during the fabrication of semiconductor devices.

SUMMARY OF THE INVENTION

It is an object of the present invention to provide a lithography method for use in the manufacture of semiconductor devices, which prevents lithographic exposure of a periphery region or edge region of a semiconductor wafer.

It is another object of the present invention to provide a lithography method for use in the manufacture of semiconductor devices, which prevents the formation of black silicon in a patterned region on the periphery region of a semiconductor wafer as a result of, e.g., a deep trench manufacturing process.

According to one aspect of the present invention, a method for preventing lithographic exposure of a periphery region of a semiconductor wafer comprises applying a layer of photoresist on a semiconductor wafer, and then treating the photoresist that covers a peripheral region of the semiconductor wafer with a solution that prevents the treated photoresist from dissolving during a development process due to radiation exposure of the treated photoresist.

In another aspect of the invention, a method for preventing the formation of black silicon in a patterned region on a periphery of a semiconductor wafer comprises applying a layer of photoresist on a semiconductor wafer and applying a solution to the photoresist on a peripheral region of the semiconductor wafer. When the layer of photoresist is exposed to radiation, the solution prevents photochemical changes from occurring in the photoresist on the peripheral region of the semiconductor wafer as a result of the radiation exposure. When developing the photoresist to form a pattern, the solution prevents the exposed photoresist on the peripheral region of the semiconductor wafer from being dissolved by a developing agent. When an etch process is performed on an exposed portion of the semiconductor wafer, the photoresist on the peripheral region of the semiconductor wafer prevents widespread erosion of the substrate and prevents the formation of black silicon on the patterned region as a result of etching.

In another aspect of the invention, a lithography process comprises applying a layer of positive photoresist on a semiconductor wafer, and applying a solution to the positive photoresist that covers a peripheral region of the semiconductor wafer. Upon radiation exposure of the layer of photoresist, the solution prevents photochemical changes from occurring in the positive photoresist that covers the peripheral region of the semiconductor wafer due to radiation exposure. During development of the photoresist to form a resist pattern, the solution prevents exposed positive photoresist that covers the peripheral region of the semiconductor wafer from being dissolved by a developing agent.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 2 comprises exemplary diagrams illustrating a lithography method according to an embodiment of the invention, wherein FIG. 2a illustrates a semiconductor wafer, FIG. 2b illustrates a resist coating step, FIG. 2c illustrates a method for treating a periphery region of the wafer with a quencher solution, FIG. 2d illustrates an exposure step, and wherein FIG. 2e illustrates a development step.

FIG. 3a is an exemplary image showing results of wafer processing using an edge protection process according to the invention and FIG. 3b is an exemplary image showing results of a conventional wafer processing without edge protection.

DETAILED DESCRIPTION OF PREFERRED EMBODIMENTS

Figure 1:
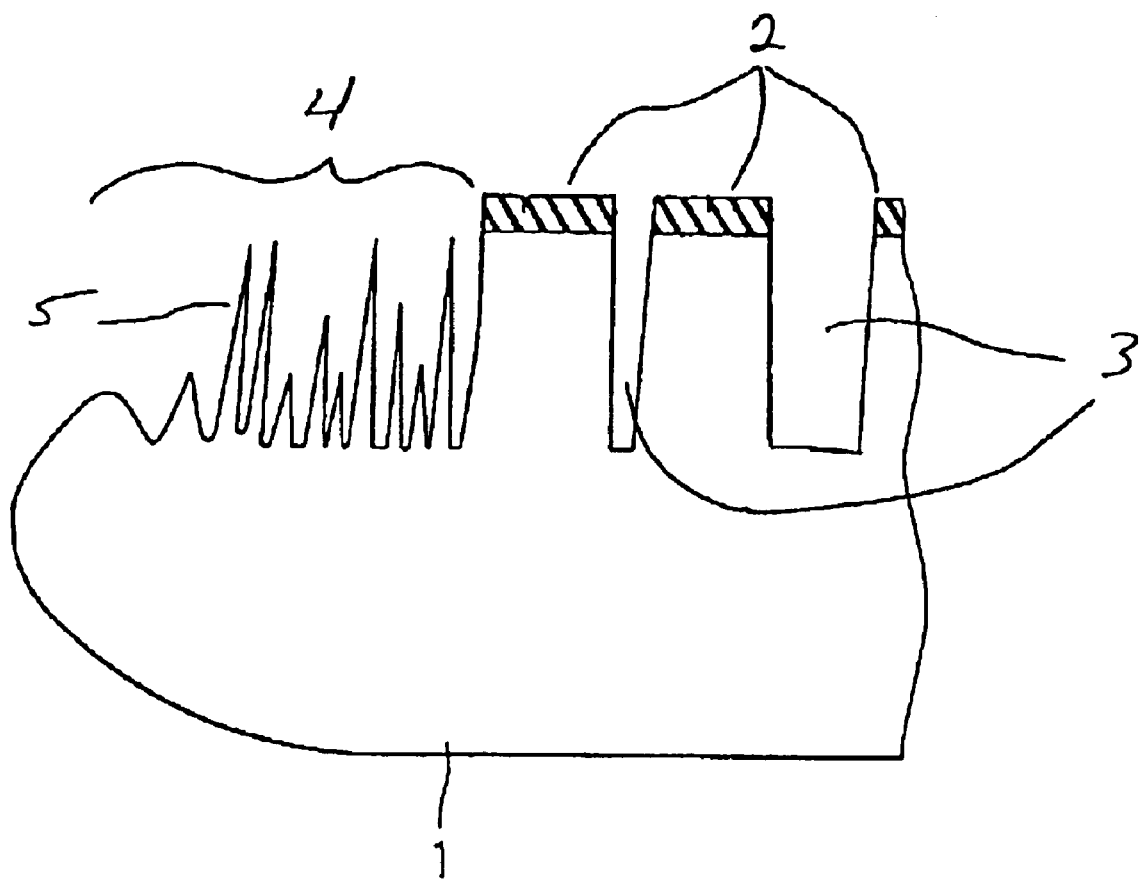
FIG. 1 is an exemplary schematic sectional side view of a wafer edge illustrating black silicon formation during trench etching process.

The present invention is directed to methods for preventing lithographic exposure of a wafer edge during a photolithography process and for preventing the formation of black silicon in a patterned region on the periphery of a semiconductor wafer using a lithographic method according to the invention.

A typical photolithography process comprises the steps of photoresist coating, exposing, developing and etching. In one preferred embodiment of the invention, a photolithography method for preventing lithographic exposure of a periphery region of a semiconductor wafer further comprises the step of applying a "quencher" solution to the photoresist that is coated on the periphery of the semiconductor wafer, prior to the exposing step. The "quencher" solution preferably comprises any suitable solution that is capable of neutralizing the acid (or the active component of the resist) that is generated in the photoresist during the exposing step, thereby preventing the photoresist from being eroded during development. In this manner, the photoresist remains on the edge of the wafer, preventing erosion of the wafer during subsequent processing such as deep trench etching. It has been determined that a lithographic method according to the present invention, wherein the wafer periphery is treated with an edge protection solution, can prevent the formation of black silicon on a pattern region on a periphery region of the wafer.

More specifically, referring to FIGS. 2a and 2b, a photoresist 20 is applied as a thin film to the surface of a semiconductor wafer 10 (e.g., a silicon substrate, a silicon substrate with an oxide film) using any known photoresist coating process. For example, a spin coating method may be used to produce a uniform, adherent film of desired thickness over the entire surface of the wafer 10. The spin coating method is carried out by dispensing photoresist solution onto the surface of the wafer 10, and then rapidly spinning the wafer until the photoresist solution is almost dry. Spin coating methods are well-known in the art, thus a detailed description thereof is omitted.

The resist 20 may comprise any suitable resist including, for example, a chemical amplified resist such as any commercially available 193 nm or 248 nm resist. For instance, the resist 20 may comprise the commercially available 82 nm AR19 (BARC) and 400 nm PAR710 resists.

Referring now to FIG. 2c, after coating the photoresist 20, and prior to the exposing step, a "quencher" solution 30 is applied to the portion of photoresist that is coated on a periphery region of the wafer 10. Preferably, the quencher 30 comprises any solution that is capable of neutralizing the acid (e.g., PAG (photo acid generator, PAC (photo active compound), etc.) that is generated, and the chemical reactions that occur, in the regions of the photoresist that are exposed to radiation during the exposing process. The quencher solution prevents photochemical changes from occurring in the positive photoresist that covers the peripheral region of the semiconductor wafer, if the peripheral region is exposed to radiation during exposure.

The quencher solution 30 may be applied using a suitable tracking and dispensing system comprising a dispensing tube 40 for applying (dripping, spraying) quencher solution 30 to the surface of the wafer. For example, in one preferred embodiment, the semiconductor wafer is placed a turntable 50 which is supported by a shaft 60. The dispensing tube 40 is placed at a desired height over edge of the wafer. Then, under the control of an automated dispensing system (which are well-known in the art), the dispensing tube 40 is moved radially inward towards the center of the wafer to a desired distance from the edge, and radially outward to the wafer edge as the wafer is rotated (via rotation of the shaft 60), and as the quencher solution is dispensed from the dispensing tube 40. The quencher solution is preferably applied by a dripping process. The amount (volume) of quencher solution used may be in the range of about 1 mil to about 10 mil.

In a preferred embodiment, the quencher solution 30 is applied to the surface of the photoresist in a periphery region of, the wafer. The periphery region is substantially defined by a circumferential ring having a width w of about 1 mm to about 10 mm from an edge of the semiconductor wafer.

The ring width of the applied quencher 30 will vary depending, for example, on the viscosity of quencher solution.

To prevent contamination of the dispensing tube 40 with base, the quencher 30 preferably comprises a salt solution or a solution with low vapor pressure. In a preferred embodiment, the quencher solution comprises a high boiling point Lewis base solvent, such as a methanol/NMP (N-methylpyrrolidone) solvent mixture comprising a NMP concentration of about 5 volume %. More specifically, by way of example, the quencher solution may comprise a NMP (1-methyl-2-pyrrolidinone) solvent having a boiling point of about 81–82° C. at 10 mHg and a melting point of −24° C.

After the quencher solution is applied, a resist drying process is preferably performed (post apply bake) to dry the resist and quencher. Thereafter, the wafer is subjected to an exposing process (FIG. 2d), whereby the resist is selectively exposed to a form of radiation using an exposure tool and mask (or reticle in a step and repeat projection system). In FIG. 2d, a photoresist layer 20a, which has undergone exposure, comprises quencher treated regions 21 and radiation exposed regions 22. When the photoresist is exposed to radiation through the reticle, the PAG, for example, in the exposed portions of the photoresist undergoes a chemical reaction in response to an actinic radiation to generate acid. If the periphery region 21 of the wafer (which is treated with a quencher solution) is exposed to radiation, the acid that is generated in the periphery regions 21 of the photoresist is neutralized through a chemical reaction with the quencher 30. Thus, the region 21 of the photoresist 20a that is treated with the quencher solution does not undergo a chemical change upon irradiation, whereas the untreated, exposed regions 22 will undergo a chemical change.

In a subsequent developing process (FIG. 2e), the photoresist is treated with a developing agent to form patterns in the photoresist. More specifically, in a preferred embodiment with a positive resist, the developer solvent dissolves the radiated (and untreated) region 22 of the photoresist 20a to form a resist pattern layer 20b on the substrate 10. Despite being irradiated, the region of photoresist that is treated with the quencher solution (i.e., the periphery region 21) does not dissolve and remains on the substrate 10.

Advantageously, since the photoresist remains on the edge of the wafer, the wafer edge will not be subject to widespread erosion, for example, in a subsequent dry etch process to form trenches in the substrate. Consequently, the formation of black silicon due to exposure of the silicon can be prevented in a patterned region on or near a periphery region of the wafer.

By way of example, FIG. 3a is an exemplary image showing results of wafer processing (trench formation) using an edge protection process according to the invention and FIG. 3b is an exemplary image showing results of a conventional wafer processing without edge protection. In FIG. 3a, three regions are shown: region "A" denotes an array region (which is not treated with quencher), region "B" denotes a transition region (which is treated with the quencher) and region "C" denotes a "hot spot" region (region of black silicon formation) near the edge of the wafer. By treating the periphery region of the wafer with a quencher solution in a lithographic method according to the invention, the region "C" is isolated from the patterned area "A" via the transition region "B". In other words, there is no contact between the array area "A" and the hot spot area C. Even though there is some formation of black silicon in the treated region(region "C"), such formation is significantly reduced as compared to conventional processes and such black silicon formation has been found not to adversely affect the wafer manufacturing process.

FIG. 3a is to be contrasted with conventional lithographic methods that result in exposure of the wafer edge as shown, for example, in FIG. 3b. In particular, FIG. 3b illustrates results of wafer processing without using quencher solution for wafer edge protection, wherein direct contact results between an array area A' and the hot spot area C'. In other words, unwanted DT patterns are formed in the untreated region.

Although preferred embodiments of the invention have been particularly described herein in conjunction with the accompanying figures, it will be appreciated by those of ordinary skill in the art that various changes may be made to such embodiment, without departing from the spirit and scope of the invention as defined by the appended claims.

What is claimed is:

1. A method for preventing lithographic exposure of a periphery region of a semiconductor wafer, comprising the steps of:

applying a layer of photoresist on a semiconductor wafer; and treating the photoresist that covers a peripheral region of the semiconductor wafer with a solution that prevents the treated photoresist from dissolving during a development process due to radiation exposure of the treated photoresist.

2. The method of claim 1, wherein the solution neutralizes acid that is generated in the photoresist due to actinic radiation.

3. The method of claim 1, wherein the peripheral region is substantially defined by a circumferential ring having a width of about 1 mm to about 10 mm from an edge of the semiconductor wafer.

4. The method of claim 1, wherein the solution comprises a salt solution.

5. The method of claim 1, wherein the solution comprises a methanol/N-methylpyrrolidone (NMP) solvent.

6. The method of claim 5, wherein the solution comprises an NMP concentration of about 5 volume %.

7. The method of claim 1, wherein the semiconductor wafer comprises a silicon substrate.

8. A method for preventing the formation of black silicon on a patterned region on a periphery of a semiconductor wafer, comprising the steps of:

applying a layer of photoresist on a semiconductor wafer;

applying a solution to the photoresist on a peripheral region of the semiconductor wafer;

exposing the layer of photoresist to radiation, wherein the solution prevents photochemical changes from occurring in the photoresist on the peripheral region of the semiconductor wafer due to radiation exposure;

developing the photoresist to form a pattern, wherein the solution prevents the exposed photoresist on the peripheral region of the semiconductor wafer from being dissolved by a developing agent; and performing an etch process on an exposed portion of semiconductor wafer, wherein the photoresist on the peripheral region of the semiconductor wafer prevents the formation of black silicon on the patterned region during the etch process.

9. The method of claim 8, wherein the peripheral region is substantially defined by a circumferential ring having a width of about 1 mm to about 10 mm from an edge of the semiconductor wafer.

10. The method of claim 8 wherein the solution comprises a salt solution.

11. The method of claim 8, wherein the solution comprises a methanol/N-methylpyrrolidone (NMP) solvent.

12. The method of claim 11, wherein the solution comprises an NMP concentration of about 5 volume %.

13. The method of claim 8, wherein the semiconductor wafer comprises a silicon substrate.

14. The method of claim 8, wherein the step of applying the solution comprises applying drops of solution to the peripheral region of the wafer.

15. The method of claim 8, wherein the step of performing an etch process comprises forming a deep trench.

16. A lithography process, comprising the steps of:
   applying a layer of positive photoresist layer on a semiconductor wafer;
   applying a solution to the positive photoresist that covers a peripheral region of the semiconductor wafer;
   exposing selected portions of the layer of photoresist to radiation, wherein the solution prevents photochemical changes from occurring in the positive photoresist that covers the peripheral region of the semiconductor wafer due to radiation exposure; and
   developing the photoresist to form a resist pattern, wherein the solution prevents exposed positive photoresist that covers the peripheral region of the semiconductor wafer from being dissolved by a developing agent.

17. The process of claim 16, wherein the peripheral region is substantially defined by a circumferential ring having a width of about 1 mm to about 10 mm from an edge of the semiconductor wafer.

18. The process of claim 16 wherein the solution comprises a salt solution.

19. The process of claim 16, wherein the solution comprises a methanol/N-methylpyrrolidone (NMP) solvent.

20. The process of claim 19, wherein the solution comprises an NMP concentration of about 5 volume %.

* * * * *